(12) United States Patent
Yu et al.

(10) Patent No.: US 8,154,842 B2
(45) Date of Patent: Apr. 10, 2012

(54) STATIC-CONDUCTING SHEET AND ELECTRONIC DEVICE USING THE SAME

(75) Inventors: Chia-Te Yu, Taipei Hsien (TW); Tai-Shan Zhu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 300 days.

(21) Appl. No.: 12/562,147

(22) Filed: Sep. 18, 2009

(65) Prior Publication Data

US 2010/0073843 A1    Mar. 25, 2010

(30) Foreign Application Priority Data

Sep. 25, 2008   (CN) .......................... 2008 1 0304658

(51) Int. Cl.
*H01H 47/00* (2006.01)
(52) U.S. Cl. ........................................ 361/212; 361/220
(58) Field of Classification Search .................. 361/212, 361/220
See application file for complete search history.

(56) References Cited

U.S. PATENT DOCUMENTS

| 5,163,850 | A | * | 11/1992 | Cronin | .......................... 439/507 |
| 5,562,489 | A | * | 10/1996 | Cronin | .......................... 439/507 |
| 2007/0247777 | A1 | * | 10/2007 | Sun et al. | ...................... 361/212 |

* cited by examiner

*Primary Examiner* — Danny Nguyen
(74) *Attorney, Agent, or Firm* — Atlis Law Group, Inc.

(57) ABSTRACT

A static-conducting sheet of conductive material is provided. The static-conducting sheet includes a longitudinal substrate, two fixed portions and at least one elastic arm. The fixed portion includes a perpendicular portion and a lateral portion. The perpendicular portion extends from two opposite ends of the longitudinal substrate. The perpendicular portion extends perpendicularly upward from the planar surface. The lateral portion is parallel to the planar surface. The elastic arm includes a fixed end and a distal end. The fixed end is fixed on the longitudinal substrate. The arm extends perpendicular from the planar surface. The arm includes a fixed end and a distal end. The fixed end is connected to the longitudinal substrate, and the distal end is hooked.

13 Claims, 4 Drawing Sheets

STATIC-CONDUCTING SHEET AND ELECTRONIC DEVICE USING THE SAME

BACKGROUND

1. Technical Field

The present disclosure relates to electronic shielding and, particularly, to a static-conducting sheet preventing static electric discharge.

2. Description of Related Art

Miniaturization and lighter weight requirements for portable electronic devices have resulted in improved semiconductor and mounting techniques. However, such reduction can encounter electrostatic problems. Some electronic components, such as transistors, are highly susceptible to electrostatic discharge. Furthermore, occurrence of the static charges may create noise or result in malfunctioning of the electronic component(s).

Static electricity must be conducted to the ground to protect the electronic components. Conventional electronic devices often use a piece of copper foil to connect the element to the ground. Copper foil, however presents an unstable shape, making positioning thereof difficult to control.

What is needed, therefore, is a static-conducting sheet with a stable shape to overcome the described limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the static-conducting sheet and the electronic device using same.

DETAILED DESCRIPTION

Embodiments of the present disclosure will now be described in detail, with reference to the accompanying drawings.

Figure 1:
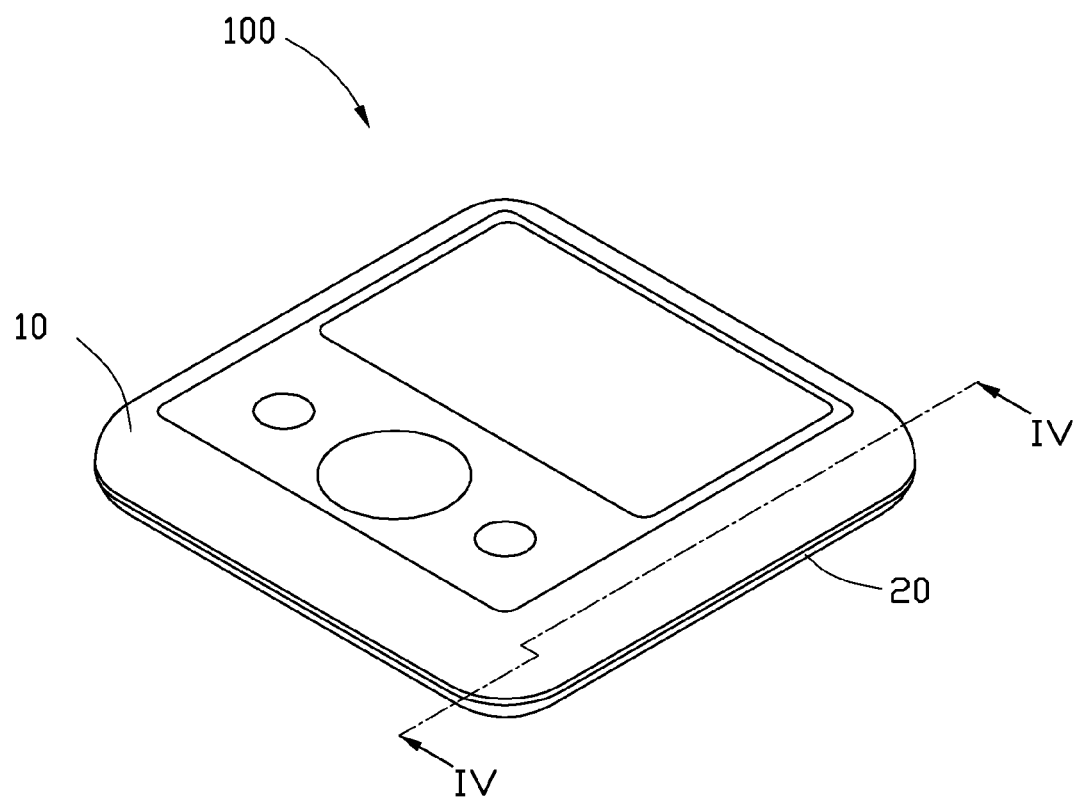
FIG. 1 is a schematic assembled view of an electronic device using a static-conducting sheet according to an exemplary embodiment.
Figure 2:
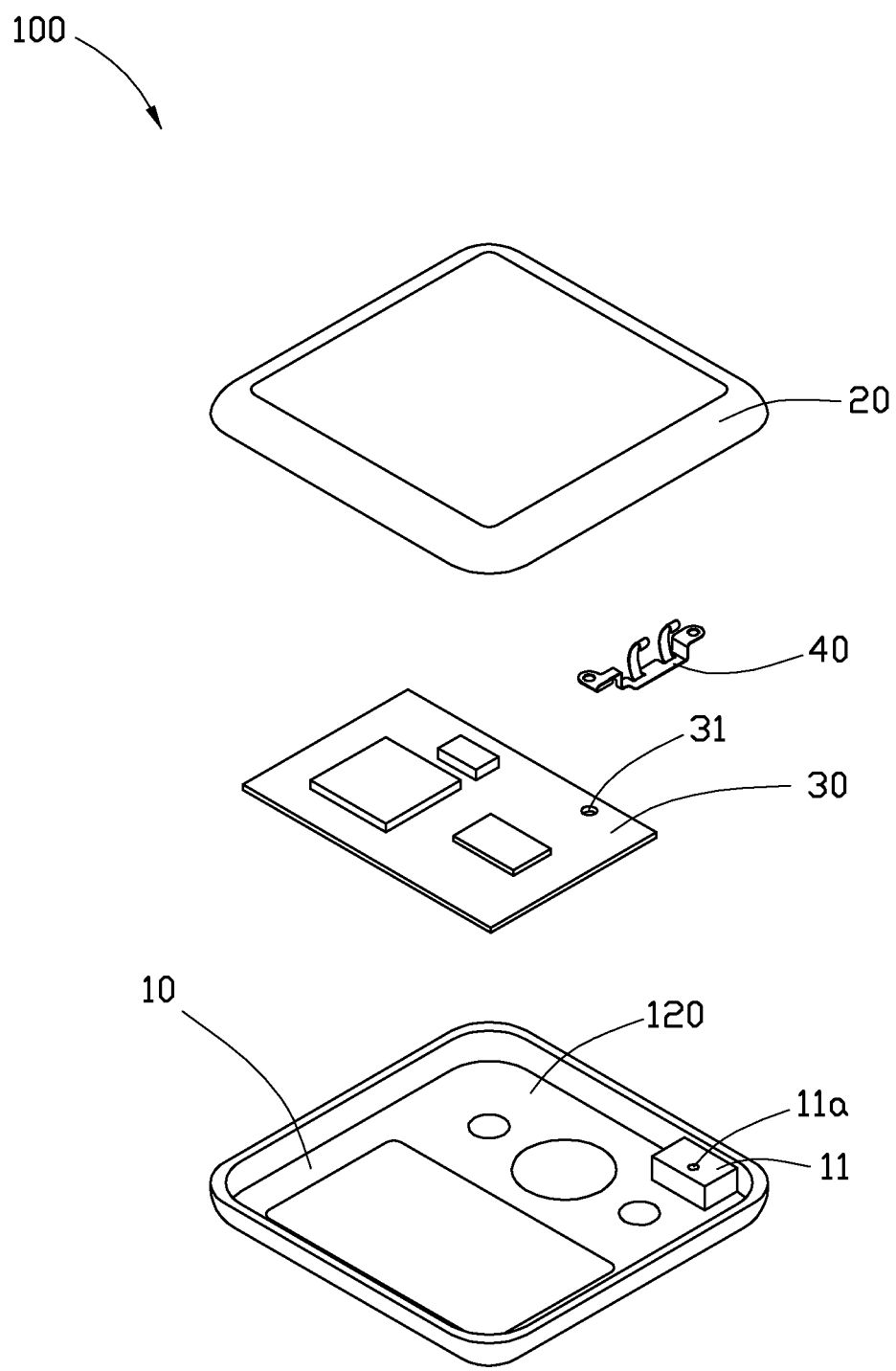
FIG. 2 is an exploded view of the electronic device of FIG. 1.

Referring to FIGS. 1 and 2, an electronic device 100, according to an exemplary embodiment, is shown. The electronic device 100 includes a first shell 10, a second shell 20, a circuit board 30, and a static-conducting sheet 40. The first shell 10 is attached to the second shell 20, such that a receiving space 120 is formed therebetween. The circuit board 30 and the static-conducting sheet 40 are received in the receiving space 120. The first shell 10 includes a ground terminal 11. A fastener hole 11a is formed on the ground terminal 11. The circuit board 30 is fixed on the first shell 10. The circuit board 30 defines a ground pad 31 thereon. In the present embodiment, the ground pad 31 is disposed at a corner of the circuit board 30. The first shell 10, the second shell 20 and the circuit board 30 are electrically connected via the static-conducting sheet 40.

Figure 3:
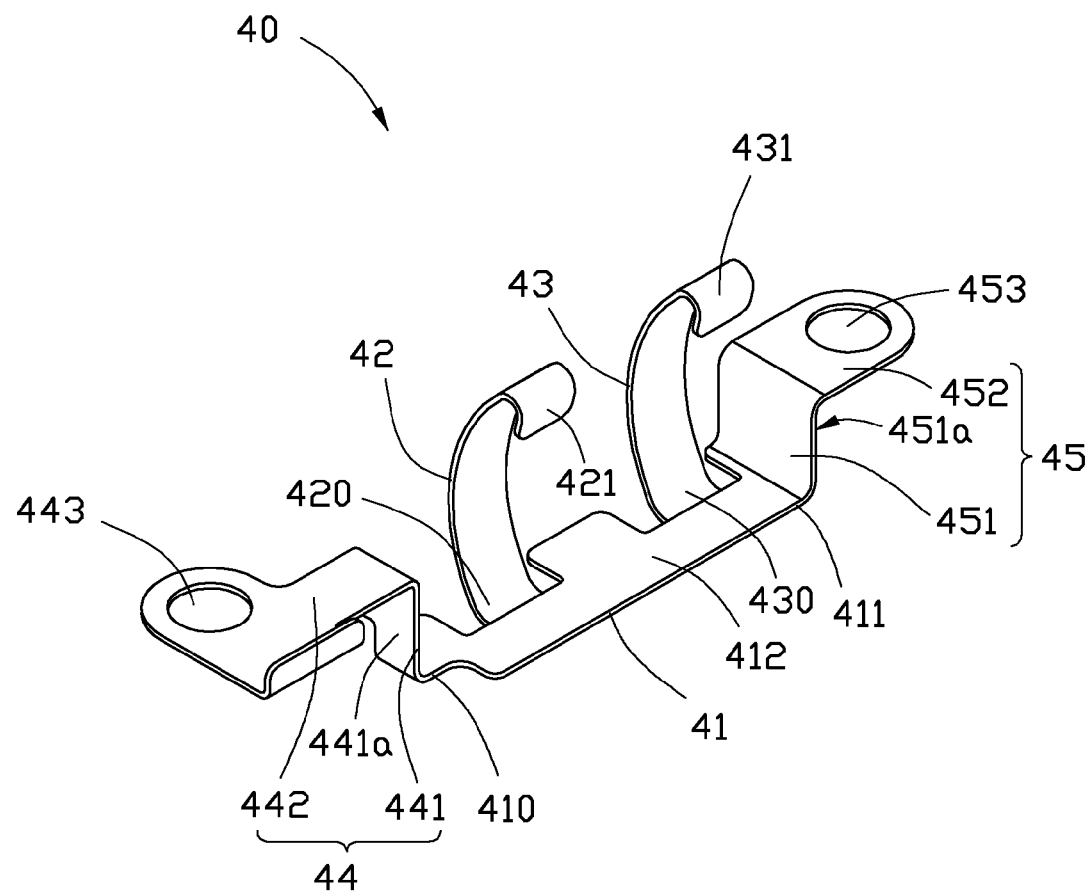
FIG. 3 is a schematic view of a static-conducting sheet, used in an electronic device, such as, for example, that of FIG. 1.

Referring to FIG. 3, the static-conducting sheet 40 is of conductive material, in the present embodiment, such as copper. The static-conducting sheet 40 includes a longitudinal substrate 41, a first elastic arm 42, a second elastic arm 43, a first fixed portion 44, and a second fixed portion 45. The longitudinal substrate 41 includes a first end 410, a second end 411 and a planar surface 412. The second end 411 is opposite to the first end 410.

The first fixed portion 44 includes a first perpendicular portion 441 and a first lateral portion 442. The first perpendicular portion 441 is connected to the first end 410. The first perpendicular portion 441 extends perpendicular from the planar surface 412. The first perpendicular portion 441 includes a first side surface 441a away from the second fixed portion 45. The first lateral portion 442 extends from the first side surface 441a. The first lateral portion 442 is parallel to the planar surface 412. The second fixed portion 45 includes a second perpendicular portion 451 and a second lateral portion 452. The second perpendicular portion 451 is connected to the second end 411. The second perpendicular portion 451 extends perpendicular from the planar surface 412. The second perpendicular portion 451 includes a second side surface 451a away from the first fixed portion 44. The second lateral portion 452 extends from the second side surface 451a. The second lateral portion 452 is parallel to the planar surface 412. A first hole 443 is formed on the first lateral portion 442. A second hole 453 is formed on the second lateral portion 452.

Both the first elastic arm 42 and the second elastic arm 43 are curved. The first elastic arm 42 and the second elastic arm 43 extend upward perpendicular to the planar surface 412. The first elastic arm 42 and the second elastic arm 43 are parallel. The first elastic arm 42 includes a first fixed end 420 and a first distal end 421. The second elastic arm 43 includes a second fixed end 430 and a second distal end 431. The first fixed end 420 and the second fixed end 430 are fixed on the longitudinal substrate 41. In the present embodiment, the first fixed end 420 and the second fixed end 430 are fixed in the center of the longitudinal substrate 41. The first distal end 421 and the second distal end 431 are hooked to increase contact area with the second shell 20.

Figure 4:
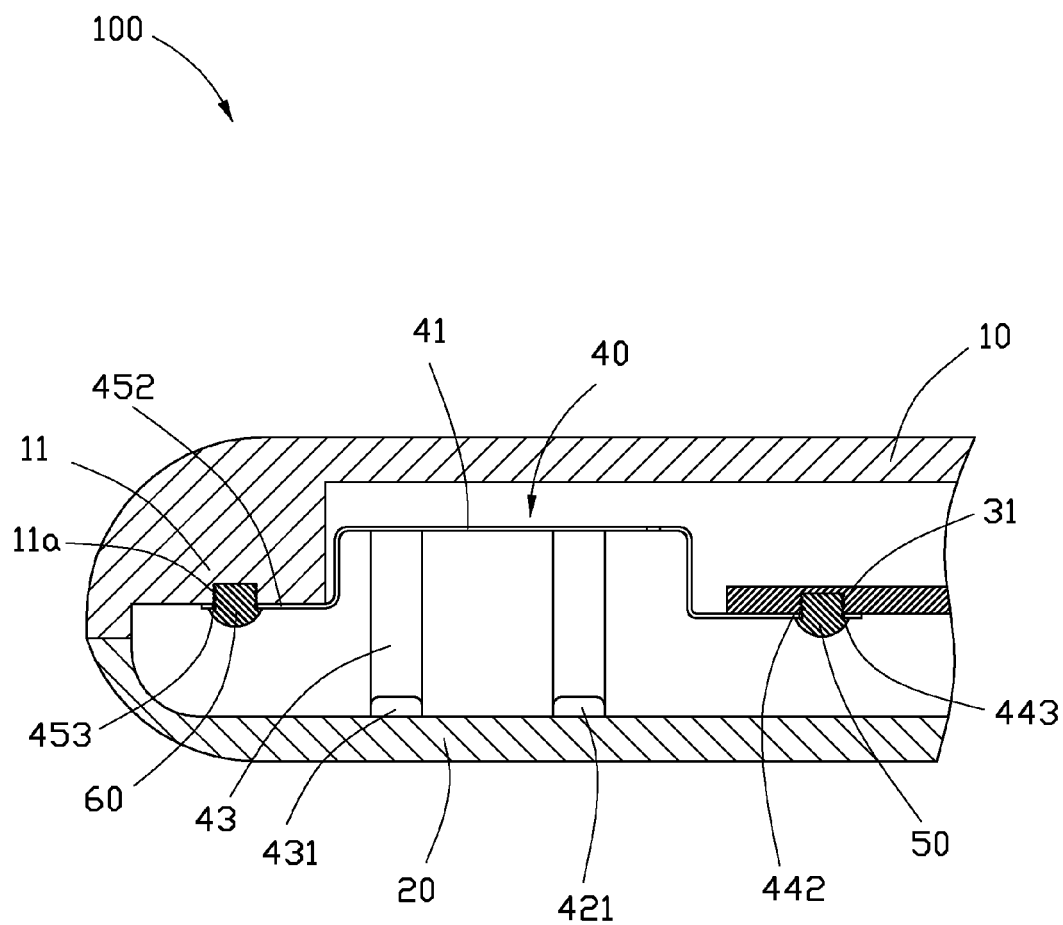
FIG. 4 is a cross-section along line IV-IV of the electronic device of FIG. 1.

Referring to FIG. 4, the static-conducting sheet 40 is received in the receiving space 120. The first lateral portion 442 is electrically coupled to the ground pad 31 of the circuit board 30. In the present embodiment, the first lateral portion 442 is secured with the ground pad 31 using a copper fastener 50 through the first hole 443. The second lateral portion 452 is electrically coupled to the ground terminal 11 of the first shell 10. In the present embodiment, the second lateral portion 452 is secured with the ground terminal 11 using a copper fastener 60 through the fastener hole 11a and the second hole 453. The first distal end 421 and the second distal end 431 are contacted with the second shell 20. And the static-conducting sheet 40 can conduct static electricity from the circuit board 30 and the second shell 20 to the ground terminal 11.

The static-conducting sheet 40 can contact the second shell 20 without soldering, and the first distal end 421 can increase contact area with the second shell 20.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A static-conducting sheet of conductive material, the static-conducting sheet comprising:

a longitudinal substrate comprising a planar surface;

two fixed portions extending from two opposite ends of the longitudinal substrate, each fixed portion comprising a perpendicular portion and a lateral portion, the perpendicular portion connected to an end of the longitudinal substrate, the perpendicular portion perpendicularly extending from the planar surface of the longitudinal substrate, the lateral portion parallel to the planar surface of the longitudinal substrate and extending along a direction away from a center of the longitudinal substrate, and the lateral portion defining a hole thereof; and at least one elastic arm fixed on the longitudinal substrate, the elastic arm extending perpendicular from the planar surface of the longitudinal substrate and comprising a fixed end connected to the longitudinal substrate, and a hooked distal end.

2. The static-conducting sheet as claimed in claim 1, wherein the static-conducting sheet is copper.

3. The static-conducting sheet as claimed in claim 1, wherein the at least one elastic arm is located between the two fixed portions.

4. The static-conducting sheet as claimed in claim 1, wherein the static-conducting sheet comprises two parallel elastic arms.

5. The static-conducting sheet as claimed in claim 1, wherein at least one elastic arm is curved.

6. An electronic device comprising:

a first shell comprising a ground terminal;

a second shell connected to the first shell, the second shell and the first shell cooperatively defining a receiving space;

a circuit board received in the receiving space, the circuit board comprising a ground pad; and a static-conducting sheet, made of conductive material, received in the receiving space, the static-conducting sheet comprising:

a longitudinal substrate comprising a planar surface;

two fixed portions extending from two opposite ends of the longitudinal substrate, each fixed portion comprising a perpendicular portion and a lateral portion, the perpendicular portion connected to an end of the longitudinal substrate, the perpendicular portion extending perpendicularly upward from the planar surface of the longitudinal substrate, the lateral portion parallel to the planar surface of the longitudinal substrate, one lateral portion being electrically coupled to the ground pad of the circuit board, the other lateral portion being electrically coupled to the ground terminal of the first shell; and at least one elastic arm fixed on the strip-shape, the elastic arm perpendicularly extending away from the planar surface of the longitudinal substrate, the elastic arm comprising a fixed end and a distal end, the fixed end connected to the longitudinal substrate, the distal end hooked, and the distal end resisting the second shell.

7. The electronic device as claimed in claim 6, wherein the static-conducting sheet is copper.

8. The electronic device as claimed in claim 6, wherein the at least one elastic arm is located between the two fixed portions.

9. The electronic device as claimed in claim 6, wherein the static-conducting sheet comprises two parallel elastic arms.

10. The electronic device as claimed in claim 6, wherein at least one elastic arm is curved.

11. The electronic device as claimed in claim 6, wherein the lateral portion defines a hole therein.

12. The electronic device as claimed in claim 6, wherein the lateral portion is secured with the ground pad through a copper fastener.

13. The electronic device as claimed in claim 6, wherein the lateral portion is secured with the ground terminal through a copper fastener.

* * * * *